United States Patent [19]

Pierrat

[11] 4,284,605
[45] Aug. 18, 1981

[54] LINEAR DRIVE SHAFT SEAL

[75] Inventor: Michel A. Pierrat, Andover, Mass.

[73] Assignee: Ferrofluidics Corporation, Nashua, N.H.

[21] Appl. No.: 149,141

[22] Filed: May 14, 1980

[51] Int. Cl.³ .................... C30B 15/30; C30B 35/00; F16J 15/56
[52] U.S. Cl. ...................... 422/249; 74/110; 74/467; 156/617 SP; 277/80; 308/187; 308/187.2
[58] Field of Search ............... 422/249, 310; 156/617 SP; 74/99 A, 110, 89.15, 467; 308/36.1, 36.3, 187, 187.1, 187.2; 277/80

[56] References Cited

U.S. PATENT DOCUMENTS

| 3,612,549 | 10/1971 | Berkowitz | 277/80 |
| 3,620,584 | 11/1971 | Rosensweig | 277/80 |
| 3,643,964 | 2/1972 | Snelling et al. | 422/249 |
| 3,740,060 | 6/1973 | Miskolczy et al. | 277/80 |
| 3,777,580 | 12/1973 | Brems | 74/110 |
| 4,075,898 | 2/1978 | Carlson et al. | 74/89.15 |
| 4,089,624 | 5/1978 | Nichols et al. | 74/89.15 |
| 4,176,002 | 11/1979 | Queniss et al. | 422/249 |
| 4,187,933 | 2/1980 | Calabrese et al. | 74/89.14 |

Primary Examiner—Bradley Garris
Attorney, Agent, or Firm—Richard P. Crowley

[57] ABSTRACT

A linear drive-shaft sealing apparatus particularly useful in removing crystals from a melt solution of an evacuated chamber, which sealing apparatus comprises a first input drive shaft and a second output drive shaft, both shafts adapted for linear movement, a cylindrical element disposed between the input and output shafts and adapted for rotary movement, a housing surrounding the cylindrical element, and a multistage, magnetic seal apparatus which provides a magnetic seal between the housing and the cylindrical element.

11 Claims, 2 Drawing Figures

LINEAR DRIVE SHAFT SEAL

BACKGROUND OF THE INVENTION

Linear drive shafts are used in many mechanical applications where linear (to and fro) motion is necessary to perform a task. Such linear drive shafts are driven by a variety of driving means; for example, hydraulic pressure against a spring-loaded plunger is one effective linear actuator. Other linear drive means include solenoids, shuttle rods, and cam/follower arrangements. In simple systems, linear-drive shafts can also be manually operated.

A major disadvantage of linear drive shafts is that such shafts are difficult to seal effectively. Where a linear drive shaft is expected to operate in a contaminant-free or evacuated environment, it is often not practical to include the driving means within the work chamber because of either the bulk of the driving means or because it is, itself, a source of contaminants. In such cases it is then necessary to seal the drive shaft at its point of entry into the work chamber.

Sealing a sliding shaft is a difficult task. One conventional method of sealing a shaft is to surround the shaft with a close-fitting sleeve and then fill the annular space between the shaft and the sleeve with a high-density lubricant. This solution is often impractical in evacuated work chambers and is less than satisfactory in other situations as well because the lubricant tends to be forced out of the annular space between the sleeve and the shaft as a result of the to-and-fro motion.

An improvement on the sleeve and lubricant sealing apparatus calls for the use of a magnetic fluid in conjunction with a magnetized shaft and a magnetically permeable sleeve (or vice-versa, a magnetized sleeve and magnetically permeable shaft). While this arrangement improves the sealing capabilities of the sleeve and shaft apparatus, particularly in evacuated systems, this improvement also suffers from the problem of eventual migration of the lubricant out of the annular space between the sleeve and shaft.

Therefore, it is desirable to provide for a simple, effective, linear drive-shaft sealing apparatus, particularly one which is adapted for use with high-vacuum, contaminant-free environments.

One particular application where linear drive shafts play an important role is in the fabrication of high-quality, semiconducting, piezoelectric and optical crystals. Such crystals are typically formed from a supersaturated melt solution by slowly removing a crystal seed from the melt. In fabricating such crystals, it is essential that the seed be removed in a controlled manner to ensure continuous growth with an orderly crystal lattice structure. It is also essential that the crystal-growing operation be conducted in a contaminant-free, high-vacuum environment so that the crystals formed are of the utmost purity.

Therefore, it would also be desirable to provide for an improved linear drive-shaft sealing apparatus for use in conjunction with crystal-growing operations.

SUMMARY OF THE INVENTION

My invention relates to linear drive-shaft sealing apparatuses and methods of sealing or isolating segments of a linear drive shaft, particularly in contaminant-free environments. My invention also concerns apparatuses for moving workpieces into or within an evacuated chamber without introducing contaminants and finds particular application in the fabrication of high-quality piezoelectric, semiconducting and optical crystals to remove the crystals from the melt in a controlled and contaminant-free manner.

I have discovered that a drive shaft in linear (to and fro) motion may be isolated from its driving means and maintained in a contaminant-free environment by converting the linear motion of the drive means, such as a hydraulic actuator or solenoid, into rotary motion of a cylindrical element, surrounding the cylindrical element by a housing which forms part of the contaminant-free vessel and then sealing the space between the cylinder and the housing with a magnetic-fluid seal. The rotary motion of cylinder may then be reconverted into linear motion by contaminant-free means within the vessel connected to isolated portions of the cylinder.

A rotary-drive means, such as a stepping motor, may be used to drive a linear drive shaft isolated in a vessel by first turning a rotatable cylinder passing through a housing forming part of the vessel with a magnetic-fluid-seal apparatus, and sealing the space between the cylinder and the housing. The motion of the sealed portion of the rotating cylinder may then be converted into linear motion by means within the vessel, free from any contaminants generated by the driving means.

My invention has particular application in evacuated vessels, where it is necessary to move a workpiece in a linear fashion within the vessel, while maintaining a vacuum in the vessel. For example, my invention may be used in evacuated sputtering chambers to move the electron source, the target or the workpiece into proper alignment for cathodic deposition. My invention also finds application in lock-load vacuum systems where it may be used to move a workpiece from a roughly evacuated chamber (i.e., $10^{-2}$ torr) into a hard vacuum (i.e., $10^{-7}$ torr or lower). Presently lock-load systems typically employ chain drives which result in considerable vacuum leakage.

More particularly, my invention has application in the fabrication of high-quality, semiconducting crystals, such as silicon and germanium; piezoelectric crystals, such as quartz; and optical crystals, such as corundum. In fabricating such crystals orderly crystal lattice structure is assured by removing the crystal from the melt solution in a controlled manner. My invention permits such "crystal pulling" by manual operation, or by means of a stepping motor, without introducing contaminants into the crystallizing vessel.

I have discovered that a highly effective seal can be created for linear actuators by converting the linear motion to rotary motion and using a multiple-stage, magnetic-fluid seal apparatus to seal the space between the rotating element and a housing or sleeve. Multiple-stage, magnetic-fluid seals are discussed in U.S. Pat. No. 3,620,584, issued to Ronald E. Rosensweig on Nov. 16, 1971, hereby incorporated by reference. A multi-stage seal is one in which a single magnet is used to provide a plurality of magnetic-fluid seals in series.

One advantage of multi-stage seals in vacuum or pressurized situations is that each stage acts as a relief valve, with a certain lifting pressure and a certain resealing pressure. In operation, when several stages act in series, they lift and reseal as required, allowing the interspaces to become pressurized until each stage is just supporting its resealing pressure. The pressure-bearing capacity of such stages is cummulative; one need only design the seal so that the operating pressure differential is less than the sum of all the resealing pressures. Thus, there will always be spare stages that remain intact and prevent net leakage from the seal.

Various means to convert linear motion to rotary motion, and vice-versa, may be used in my invention. One means is a jack screw wherein substantially flat-crested, or acme, threads are formed on the linear-drive shaft to engage a helical thread-receiving path bored in the rotating element. In another form the rotating element may be a sleeve, sealed in the middle to prevent axial migration of contaminants, and having a nut affixed to each end to receive the screw threads of the shaft segments. Another means to convert linear motion to rotary motion is a ratchet and catch wherein a reciprocating catch engages the teeth of a ratchet wheel to turn it, or vice-versa. Additionally, a cam and follower may be used whereby the rotation of the eccentric cam causes linear motion of the follower.

For the purpose of illustration only, my invention will be described in connection with certain preferred embodiments; however, it is recognized that those persons skilled in the art may make various changes and modifications in my invention and apparatus, all without departing from the spirit and scope of my invention. For example, one skilled in the art can easily design a variety of bearings for use in my invention in order to maintain the annular gaps between the multi-pole pieces and the cylindrical element. Likewise, the design of stops and keyholes, to assure that the cylindrical element does not move linearly and shaft segments do not rotate, is well within the capability of the skilled artisan. Further, my method and invention are not limited to evacuated systems and crystal-growing operations but, rather, may be employed wherever linear actuators are used.

Moreover, the number of stages in the magnetic-fluid seal may vary depending upon the differential pressure between the driving-means environment and the isolated environment. Each stage can support a differential pressure proportional to the strength of the magnetic field across the gap and the magnetic saturation value of the fluid. Additionally, my invention has been described as comprising a magnetic module situated within a housing and magnetically permeable rotating element. It is obvious that the equivalent structure of a magnetic module in the rotating member and a magnetically permeable housing may also be employed.

It should also be noted that in the first embodiment described below, two identical jack screws are used as the linear/rotary convertors. In this manner, movement of the isolated shaft will be identical to the movement of the input shaft. However, movement of the isolated shaft segment may be increased or decreased in relation to the input by varying the pitch of either, or both, threaded shafts and their respective threaded bores on the revolving cylinder. Thus, for example, a one-inch movement of the input shaft can result in two inches or movement by the isolated segment by proper selection of thread pitches.

DESCRIPTION OF THE EMBODIMENTS

Figure 1:
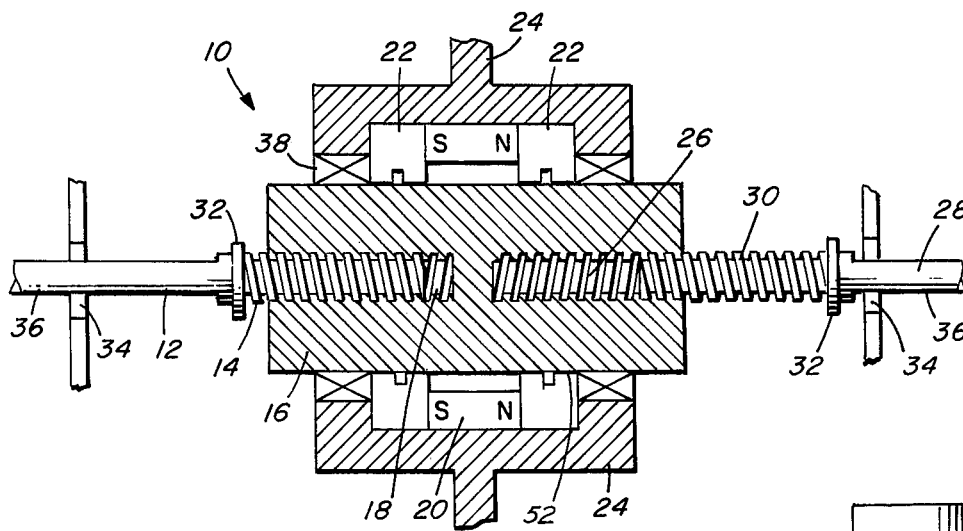
FIG. 1 is a schematic, partial cross-sectional view of a linear drive-shaft sealing apparatus of my invention.

FIG. 1 shows the linear drive-shaft sealing apparatus 10 of my invention in use as a linear shaft feed-through apparatus. The housing 24 secures the apparatus, and also forms the boundary between the driving means (not shown) and the isolated environment.

Input shaft 12 is connected to a linear driving means (not shown) at one end and has raised, flat-crested, threads 14 at the other end. The threads 14 engage an internally threaded bore 18 at one end of cylinder 16. At the other end of cylinder 16 is another threaded bore 26 which receives the threaded portion 30 of the isolated drive-shaft segment 28. Bores 18 and 26 are not connected.

The portion of cylinder 16 which receives the isolated shaft segment 28 is sealed by a magnetic module disposed within the housing 24, the module comprising an annular axially polarized magnet 20 and annular pole pieces 22 disposed on both sides of the magnet 20. The pole pieces 22 each have two inwardly (radially) extending portions which each define a narrow gap between the pole piece 22 and the cylinder 16. Each of these gaps is filled with magnetic fluid or ferrofluid 52 to form four separate "O" ring-type fluid seals. Bearings 38 keep cylinder 16 from moving linearly and maintain a constant gap width between the pole pieces 22 and the cylinder 16.

Each of the shaft segments 12 and 28 includes stops 32, to prevent overdriving, and key forms 36 (i.e., grooves) which fit into stationary keyholes 34 to prevent shaft rotation.

In operation a linear driving means (not shown) drives input shaft segment 12 forward or backwards. The interaction of the threads 14 and the bore 18 causes the cylinder 16 to rotate in response to the driving means. As the cylinder 16 rotates, shaft segment 28 is drawn in a reciprocal fashion into, or out of, bore 26. Shaft segment 28 is isolated from the driving means within the housing 24 by the multiple stages of magnetic fluid 52 held by magnetic force within the gaps between the pole pieces 22 and the cylinder 16.

Figure 2:
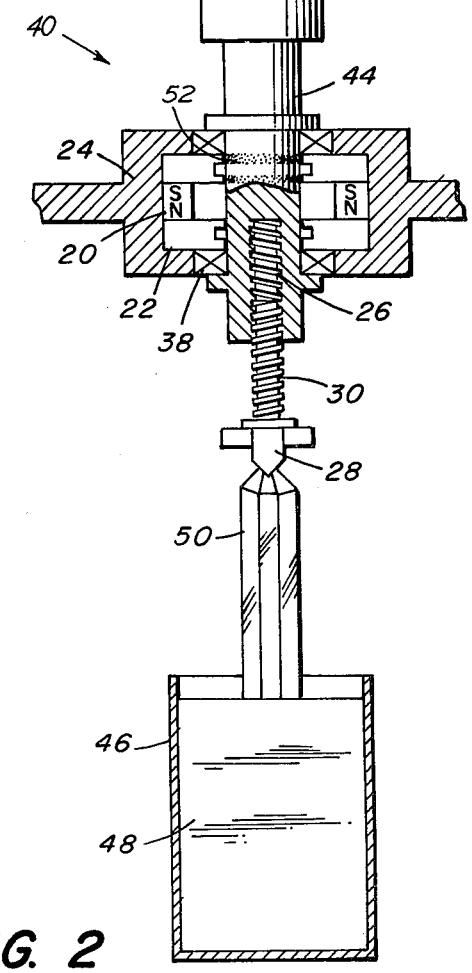
FIG. 2 is a schematic, partial cross-sectional view of an alternative embodiment of my sealing apparatus for use in crystal growing.

FIG. 2 shows an alternative embodiment 40 of my apparatus where the initial driving means is a rotary stepping motor 42 and the apparatus is used to pull crystals 50 from a melt solution 48. In FIG. 2, the stepping motor 42 is connected to one end of a cylinder 44, which passes through a housing 24. At the other end of the cylinder 44 is a threaded bore 26 which receives the threaded portion 30 of a crystal pulling shaft 28. The shaft 28 is connected to a crystal 50 growing from a melt solution 48 in a crystalizer 46. A magnetic module, similar in form to the module of FIG. 1, surrounds cylinder 44 and comprises a magnet 20 and pole pieces 22 defining a plurality of gaps filled with magnetic fluid 52. Bearings 38 secure the housing 24 and the module about the cylinder 44.

In operation a supersaturated melt solution 48 is prepared in a crystalizer 46, the crystalizer 46 being situated in a contaminant-free environment defined in part by housing 24. The unthreaded end of shaft 28 includes a crystal seeding mechanism which is inserted into the melt solution to form a crystal 50. Stepping motor 42 rotates cylinder 44, which causes shaft 28 to be drawn up by the interaction of the threads 30 and the cylinder 26. Thus, the crystal growth rate may be controlled and orderly crystal lattice structure maintained by the stepping motor 42 while the motor itself is sealed from the contaminant-free crystal-growing environment by the multiple-stage seals of magnetic fluid 52 held by magnetic force within the gaps between pole pieces 22 and cylinder 44.

What I claim is:

1. A linear drive-shaft sealing apparatus useful for magnetic isolation of a linear-motion drive shaft from a driving means, the apparatus comprising:
   (a) a first input drive shaft adapted for connection to the driving means and for linear motion thereby;
   (b) a magnetically permeable, cylindrical element capable of rotary motion;
   (c) a first means to convert the linear motion of the input drive shaft by the driving means into rotary motion of the cylindrical element;
   (d) a housing surrounding the cylindrical element, and defining an annular space therebetween;
   (e) a second, isolated, output drive shaft;
   (f) a second means to reconvert the rotary motion of the cylindrical element to linear motion of the second drive shaft; and
   (g) a multiple-stage, magnetic-fluid seal to isolate the second drive shaft from the first drive shaft, the seal comprising:
      (i) a permanent ring magnet disposed within the housing and surrounding the cylindrical element;
      (ii) one or more magnetically permeable pole pieces adjacent to the magnet and defining in the space between the housing and the cylindrical element a plurality of gaps, across which gaps the flux of the magnetic field passes; and
      (iii) magnetic fluid captured within the gaps to provide a plurality of close, but separate, seal stages, whereby the second drive shaft is driven in a linear manner by the driving means, but is isolated therefrom by the multiple-stage magnetic fluid seal between the housing and the cylindrical element.

2. The apparatus of claim 1, wherein the first means to convert linear motion to rotary motion and the second means to reconvert rotary motion to linear motion comprise:
   (a) screw threads on both the first input drive shaft and on the second output drive shaft; and
   (b) threaded bores in one and the other ends of the cylindrical element, whereby the linear motion of the first shaft at one end of the cylindrical element causes the cylindrical element to rotate and thus drive the isolated second shaft into, or out of, the bore at the other end of the cylindrical element.

3. The apparatus of claim 2 wherein the pitch of the threads of the first means is different in pitch from the pitch of the second means, in order to change the rate of motion of the second output drive shaft in relation to the motion of the first input drive shaft.

4. The apparatus of claim 1, which apparatus further comprises:
   (a) a first key form on the first input drive shaft;
   (b) a second key form on the second isolated output shaft;
   (c) a first stationary keyhole through which the input drive shaft passes, and a second stationary keyhole through which the isolated output shaft passes, whereby rotation of the first input shaft and the second isolated output shaft is prevented; and
   (d) stop means disposed about the cylindrical element to prevent linear motion of the cylindrical element.

5. The apparatus of claim 1 in combination with a driving means for the first input drive shaft and an evacuated, contaminant-free environment, wherein the second output drive shaft operates within the contaminant-free environment and is isolated from the driving means by the multiple-stage, magnetic-fluid seal.

6. The apparatus of claim 5 wherein the driving means comprises a stepping motor, and the environment comprises a vessel characterized by an evacuated chamber therein.

7. The apparatus of claim 1 in combination with a driving means, which driving means comprises a stepping motor connected to the first input drive shaft.

8. A linear drive-shaft sealing apparatus useful for magnetic isolation of a linear-motion output drive shaft from a driving means, the apparatus comprising:
   (a) a first input drive shaft adapted for connection to the driving means at one end for linear motion thereby, and having raised screw threads on its external surface at the other end;
   (b) a second output drive shaft adapted for connection to a workpiece at one end and having raised screw threads on its external surface at the other end;
   (c) a magnetically permeable, cylindrical element capable of rotary motion and having a first threaded bore at one end adapted to receive the threads of the first input drive shaft in a threadable relationship, and having a second threaded bore at the other end adapted to receive the threads of the second output drive shaft in a threadable relationship;
   (d) a housing surrounding the cylindrical element, and defining an annular space therebetween;
   (e) a first key form on the first drive shaft;
   (f) a second key form on the second drive shaft;
   (g) first and second stationary keyholes through which the first and second shafts respectively pass, whereby rotation of the first and second drive shafts is prevented;
   (h) stop means to prevent linear motion of the cylindrical element, whereby linear motion of the first input drive shaft is converted to rotary motion of the cylindrical element and reconverted to linear motion of the second drive output shaft; and
   (i) a multiple-stage, magnetic-fluid seal to isolate the second output drive shaft from the first input drive shaft, the seal comprising:
      (i) a permanent ring magnet disposed within the housing and surrounding the cylindrical element;
      (ii) one or more magnetically permeable pole pieces adjacent to the magnet and defining in the space between the housing and the cylindrical element a plurality of gaps, across which gaps the flux of the magnetic field passes; and
      (iii) magnetic fluid captured within the gaps to provide a plurality of close, but separate, seal stages, whereby the second output drive shaft is driven in a linear manner by the driving means, but is isolated therefrom by the multiple-stage, magnetic-fluid seal between the housing and the cylindrical element.

9. An apparatus for pulling crystals from a contaminant-free, supersaturated melt solution at a precise linear velocity, the apparatus comprising:
   (a) a contaminant-free vessel characterized by an evacuated enclosure;

(b) a supersaturated melt solution within the chamber of the vessel;

(c) a crystal seeding means which includes a crystal partly submerged in the melt solution; and (d) the apparatus of claim 1 wherein the second output drive shaft is connected to a nonsubmerged portion of the crystal seeding means, whereby a crystal may be pulled by linear motion from the melt solution by the linear movement of the second output drive shaft as a crystal-pulling shaft at a controlled rate, without risk of contamination from any impurities associated with the driving means.

10. The apparatus of claim 9 in combination with a driving means, which driving means comprises a stepping motor connected to the first input drive shaft.

11. An apparatus for pulling crystals from a contaminant-free, supersaturated melt solution at a precise linear velocity, the apparatus comprising:

(a) a contaminant-free vessel characterized by an evacuated chamber;

(b) a rotary stepping motor external of the vessel;

(c) a housing forming part of the vessel;

(d) a cylindrical element adapted for rotary motion passing axially through the housing and defining with the housing an annular space therebetween, the cylindrical element being connected to the stepping motor outside the vessel at one end and having a threaded bore at its other end within the vessel;

(e) an output, crystal-pulling drive shaft having external screw threads at the one end and in a threadable relationship with the threaded bore at the other end of the cylindrical element;

(f) a supersaturated melt solution within the vessel;

(g) a crystal seeding means partly submerged in the melt solution and secured for linear movement with the other end of the output, crystal-pulling drive shaft;

(h) a multi-stage, magnetic-fluid seal to isolate the rotary stepping motor and other sources of contaminants from the evacuated chamber of the vessel, which seal comprises:

(i) a permanent ring magnet disposed within the housing and surrounding the cylindrical element;

(ii) one or more magnetically permeable pole pieces adjacent to the magnet and defining in the space between the housing and the cylindrical element a plurality of gaps, across which gaps the flux of the magnetic field passes; and (iii) magnetic fluid captured within the gaps to provide a plurality of close, but separate, seal stages, whereby the output, crystal-pulling drive shaft may be driven in linear fashion by the stepping motor to withdraw a crystal from the melt solution, but is isolated from the stepping motor by the multiple-stage, magnetic-fluid seal.

* * * * *